United States Patent
Somada et al.

(10) Patent No.: US 9,379,677 B2
(45) Date of Patent: Jun. 28, 2016

(54) BIAS CIRCUIT

(71) Applicant: Hitachi, Ltd., Chiyoda-ku, Tokyo (JP)

(72) Inventors: Ichiro Somada, Tokyo (JP); Takao Okazaki, Tokyo (JP); Kenta Mochiduki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 56 days.

(21) Appl. No.: 14/318,597

(22) Filed: Jun. 28, 2014

(65) Prior Publication Data
US 2015/0002223 A1 Jan. 1, 2015

(30) Foreign Application Priority Data

Jun. 28, 2013 (JP) ................................. 2013-135767

(51) Int. Cl.
*H03F 3/45* (2006.01)
*H03F 3/19* (2006.01)

(52) U.S. Cl.
CPC .............. *H03F 3/19* (2013.01); *H03F 3/45085* (2013.01); *H03F 3/45484* (2013.01); *H03F 2200/447* (2013.01)

(58) Field of Classification Search
CPC ................................................... H03F 3/45085
USPC .................................. 330/256–256, 261, 285
See application file for complete search history.

(56) References Cited

U.S. PATENT DOCUMENTS 4,268,759 A * 5/1981 Gilbert .................... G06G 7/20
 327/349
5,990,727 A 11/1999 Kimura

FOREIGN PATENT DOCUMENTS

JP 08-321732 A 12/1996

* cited by examiner

*Primary Examiner* — Khanh V Nguyen
*Assistant Examiner* — Khiem Nguyen
(74) *Attorney, Agent, or Firm* — Miles & Stockbridge P.C.

(57) ABSTRACT

A bias circuit includes a first p-n junction element supplied with a current by a first current source connected to a low-voltage side of the first p-n junction element and a base terminal of a second transistor, a second p-n junction element supplied with a current by a second current source, the second current source connected to a low-voltage side of the second p-n junction element and a base terminal of a first transistor, the first and second transistors connected at their emitter terminals to a third current source and receiving base voltages generated by the first and second p-n junction elements, respectively. The second transistor and the first transistor constitute a differential pair in which, at a collector terminal of the second transistor, a current having a temperature coefficient that is substantially twice the temperature coefficient of the current of the second current source is obtained.

1 Claim, 3 Drawing Sheets

RL₁, RL₂ ··· OUTPUT LOAD RESISTANCE

RE₁, RE₂ ··· COMMON EMITTER RESISTANCE

Q₅, Q₆ ··· BIPOLAR TRANSISTOR

I₄ ··· CURRENT SOURCE indL₁, indL₂ ··· OUTPUT LOAD INDUCTOR

Q₇, Q₈ ··· BIPOLAR TRANSISTOR

RE₃, RE₄ ··· COMMON EMITTER RESISTANCE

I₅ ··· CURRENT SOURCE

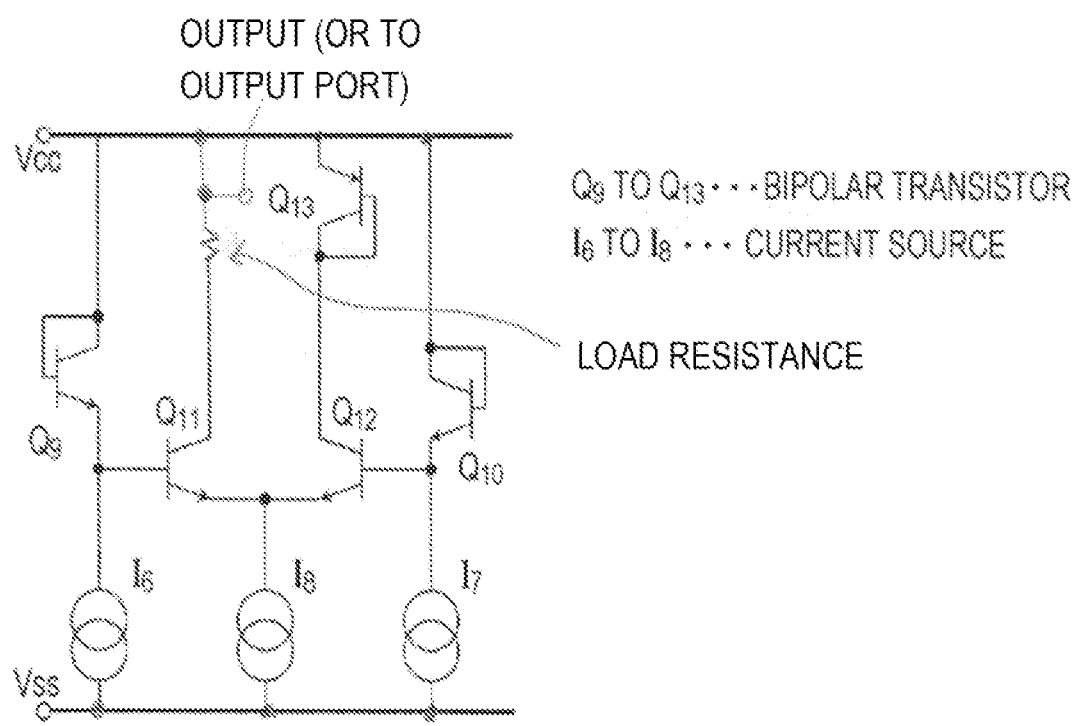

BIAS CIRCUIT

CROSS-REFERENCE TO RELATED APPLICATIONS

This application claims the priority of Japanese Patent Application No. 2013-135767, filed on Jun. 28, 2013, which is incorporated herein by reference in its entirety.

BACKGROUND OF THE INVENTION

1. Field of the Invention

The present invention relates to bias circuits, and more particularly, to a method of adjusting a bias circuit of a high-frequency amplifier for a quasi-millimeter wave band or above (20 GHz or above) constituted by a semiconductor integrated circuit, and further relates to a method of adjusting the temperature coefficient of a current source.

2. Description of the Related Art

Semiconductor devices for use in motor vehicles need to ensure operation and performance in a wide temperature range (for example, −40° C. to 150° C.)

It has not been necessarily easily achieved singly by a bias circuit to maintain the gain of a gain amplifier constant in such a wide temperature range.

Related art documents include JP-08-321732-A.

SUMMARY OF THE INVENTION

The present invention has an object of providing current sources that compensate for the temperature dependence of the gain of a high-frequency amplifier for a quasi-millimeter wave band or above (20 GHz or above).

First, description will be made of a problem of temperature stability with respect to a signal frequency amplified.

FIG. 1 shows an example of the circuit configuration of an amplifier generally used for the signal amplification of low-frequency signals (of the order of 1 MHz or below). The amplifier circuit in FIG. 1 includes output load resistances $RL_1$, $RL_2$, common emitter resistances $RE_1$, $RE_2$, bipolar transistors $Q_5$, $Q_6$, and a constant-current source $I_4$. Here, when the common emitter resistances RE in FIG. 1 are large enough to ignore the emitter resistances (re) of the transistors $Q_5$, $Q_6$ in FIG. 1, a gain (Avl) from differential input signals, $Vin^+$ and $Vin^-$, to a differential output Vod is expressed by Mathematical Formula 1:

[Mathematical Formula 1]

$$Avl = RL/RE \qquad \text{(Mathematical Formula 1)}$$

The emitter resistances of the transistors $Q_5$, $Q_6$ are expressed by Mathematical Formula 2:

[Mathematical Formula 2]

$$re = kT/qIc \qquad \text{(Mathematical Formula 2)}$$

wherein k is the Boltzmann constant: $1.38 \times 10^{-23}$ [m²kg K⁻¹ sec⁻²],

T is an absolute temperature [K], q is a charge: $1.60 \times 10^{-19}$ [C], and Ic is the value of current flowing through the transistors $Q_5$, $Q_6$.

Under the condition that the common emitter resistances RE are sufficiently large with respect to the emitter resistances of the transistors, equalizing the temperature coefficients of the output load resistances RL and the common emitter resistances RE results in the gain (Avl) being stabilized with respect to temperature.

Next, consideration will be given to the stability of gain with respect to temperature in signal amplification at a high frequency (1 MHz or above).

The circuit configuration of an amplifier using transistors used in high-frequency signal amplification is similar to that in FIG. 1. However, the values of the common emitter resistances RE used in amplification cannot take values large enough to ignore the emitter resistances of the transistors $Q_5$, $Q_6$. Thus, a gain (Avh1) at a high frequency is expressed by Mathematical Formula 3:

[Mathematical Formula 3]

$$Avh1 = RL/(RE+re) \qquad \text{(Mathematical Formula 3)}$$

That is, for the temperature stability of the gain of the high-frequency amplifier in which Mathematical Formula 3 holds, the temperature coefficients of the output load resistances RL, the common emitter resistances RE, and the emitter resistances re of the transistors need to be made uniform. For RL and RE, it is possible to make the temperature coefficients uniform by using the same kind of resistances having different resistance values. In order to make the temperature coefficients of re uniform with those of RL, RE, two variables, the absolute temperature in the numerator and the current in the denominator expressed by Mathematical Formula 2, need to be adjusted.

This shows that for the temperature stability of the gain of the high-frequency amplifier, it is necessary to provide temperature dependence to the current source of the amplifier.

The circuit configuration of a high-frequency amplifier for a quasi-millimeter wave band or above (20 GHz or above), which is a problem for the present invention, is shown in FIG. 2.

The amplifier circuit in FIG. 2 includes output load inductors indL, common emitter resistances $RE_3$ and $RE_4$, bipolar transistors $Q_7$, $Q_8$, and a constant-current source I5. A gain (Avh2) in the circuit in FIG. 2 used is expressed by Mathematical Formula 4:

[Mathematical Formula 4]

$$Avh2 = j(2\pi f)L/(RE+re) \qquad \text{(Mathematical Formula 4)}$$

wherein f is a frequency [Hz] amplified, and

L is an inductance [H] of the output load inductors L at the frequency f.

Inductors are determined by the shape of metal wiring on the semiconductor integrated circuit. The temperature coefficient of the inductance is small enough to be ignored compared with the temperature coefficient of a resistance element.

For the temperature stability of the gain under the condition that Mathematical Formula 4 holds, the temperature coefficient of the sum of the values of the common emitter resistances RE and the emitter resistances re of the transistors $Q_7$, $Q_8$ need to be equalized with the temperature coefficient of the output load inductors, that is, need to be small enough to be ignored compared with the temperature coefficient of a resistance element.

Here, for example, the temperature coefficient of the gain in the circuit in FIG. 2 is determined.

At a room temperature (303 K), each common emitter resistance RE is 10 ohm, the temperature coefficient of the resistances is −1000 ppm (the rate of change of the resistance value per degree in temperature is one thousand millionth), the value of current flowing through the transistors $Q_7$, $Q_8$ is 2.6 mA, and the current is from a fixed-value current source and is free from temperature dependence.

The results normalized by a gain at the room temperature under the above conditions are shown in FIG. 3.

As shown in FIG. 3, when the fixed-value current source is used, the temperature coefficient of the emitter resistances of the transistors is 3000 ppm, which is larger than a temperature coefficient of −1000 ppm of the resistances RE, and thus the amplification factor has a temperature coefficient of −1000 ppm.

Next, the results of calculation to determine what temperature coefficient needs to be provided to current flowing through the transistors $Q_7$, $Q_8$ to limit the temperature coefficient of the amplification factor to 10 ppm or below are shown in FIG. 4.

The results in FIG. 4 show that to provide the emitter resistances of the transistors with a temperature coefficient of 1000 ppm that is opposite in sign to a temperature coefficient of −1000 ppm of the common emitter resistances RE, it is necessary to provide current flowing through the transistors $Q_7$, $Q_8$ with a temperature coefficient of 2000 ppm.

As described above, in order to achieve the temperature stability of the gain of the high-frequency amplifier, it is found necessary to adjust the temperature coefficient of current flowing through the transistors for each amplifier.

That is, when a high-frequency amplifier for a quasi-millimeter wave band or above (20 GHz or above) is configured in multiple stages on a semiconductor integrated circuit, it becomes necessary to prepare a current source having a required temperature coefficient for each stage in order to achieve the temperature stability of the gain.

As a conceivable measure, there is a method of preparing for each stage a current source achieving a required temperature coefficient such as a generally-called band gap reference voltage circuit. In that case, it is expected that power consumption will greatly increase, and components constituting a band gap reference voltage circuit will greatly increase the area.

In addition, the temperature coefficient that can be achieved by a band gap reference voltage circuit depends on the temperature coefficients of resistance elements and transistors that can be used on a semiconductor integrated circuit. Thus this also poses a problem that a temperature coefficient exceeding the temperature coefficients of elements that can be used on a semiconductor integrated circuit is difficult to obtain.

In order to achieve the temperature stability of gain when a high-frequency amplifier for a quasi-millimeter wave band or above is practically configured in multiple stages on a semiconductor integrated circuit, a current source having a required temperature coefficient for each stage needs to be realized by a simple circuit with low power consumption and a small component area.

A circuit of the present invention shown in FIG. 5 can use currents having two different temperature coefficients to provide a current having a temperature coefficient different from both of them. Further, a circuit with a small area and low power consumption can be provided. In FIG. 5, $Q_9$ to $Q_{13}$ are bipolar transistors, and $I_6$ to $I_8$ are constant-current sources.

It is found that preparation of two or more current sources having different temperature coefficients by using the circuit of the present invention allows for generation of any temperature coefficient by addition and subtraction of the temperature coefficients.

For achieving the temperature stability of gain in a multistage high-frequency amplifier for a quasi-millimeter wave band or above on a semiconductor integrated circuit, this is a very useful circuit in that it can generate small-scale and power-saving current sources having different temperature coefficients.

BRIEF DESCRIPTION OF THE DRAWINGS

FIG. 5 is a diagram related to the present invention.

DESCRIPTION OF THE PREFERRED EMBODIMENT

Embodiment 1

Figure 1:
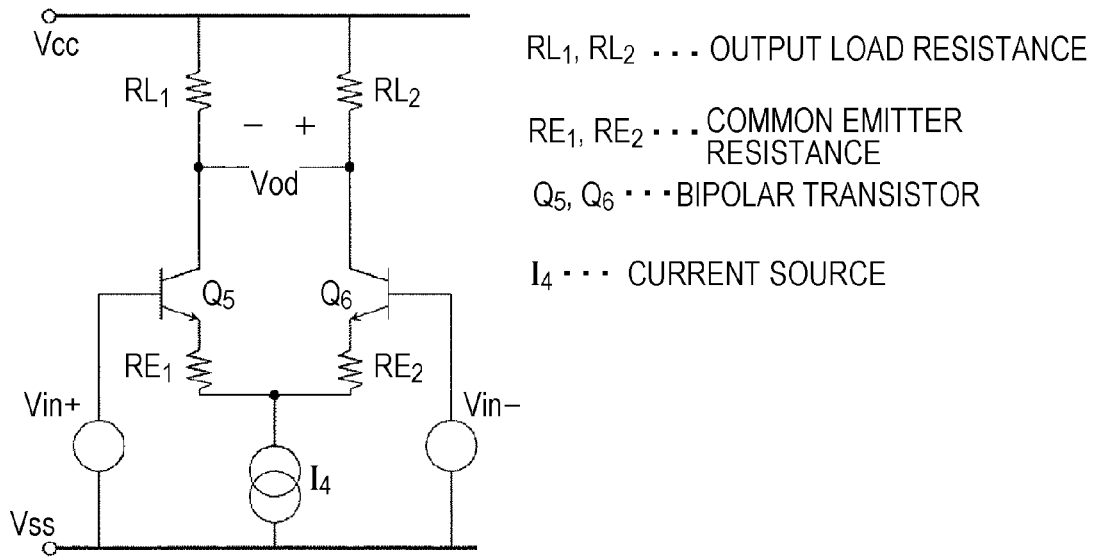
FIG. 1 is an example of the circuit configuration of an amplifier generally used in signal amplification of low-frequency signals (of the order of 1 MHz or below)
Figure 2:
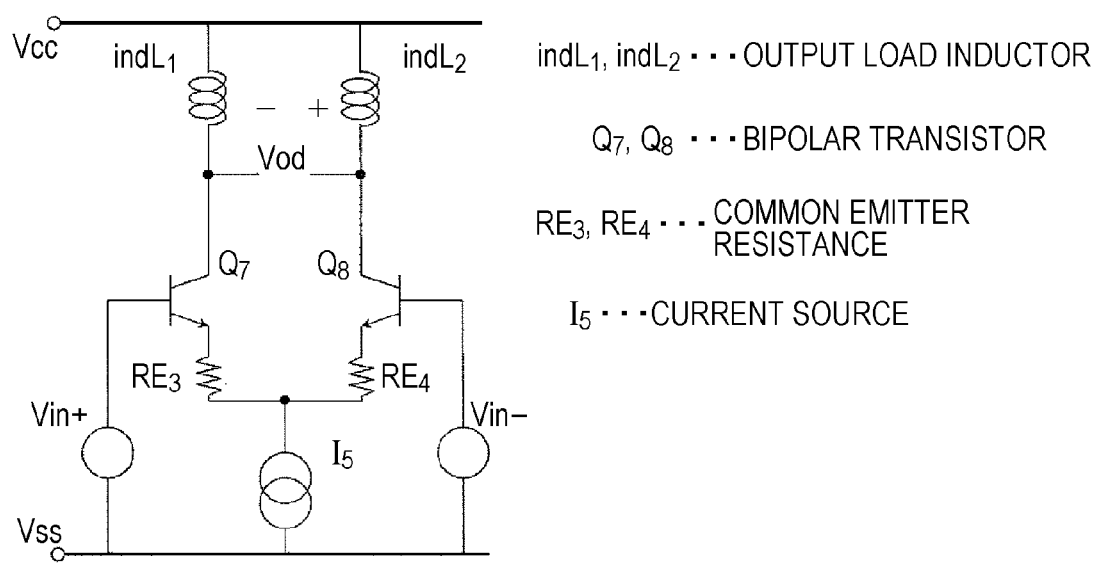
FIG. 2 is a diagram for illustrating a problem for the preset invention, and is a diagram illustrating the circuit configuration of a high-frequency amplifier for a quasi-millimeter wave band or above (20 GHz or above)
Figure 3:
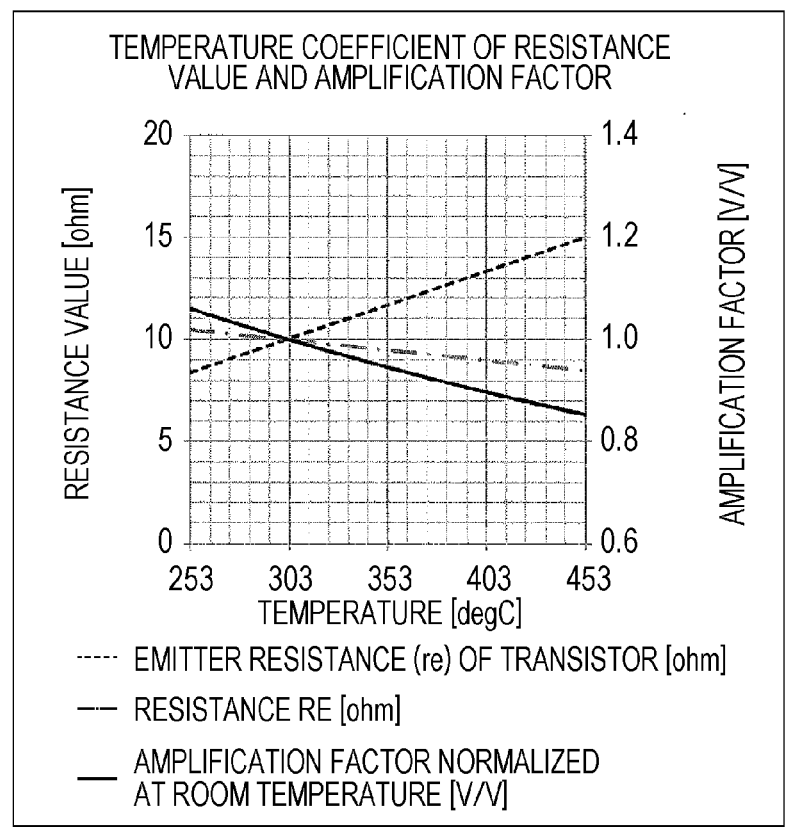
FIG. 3 is a graph showing results normalized by a gain at a room temperature.
Figure 4:
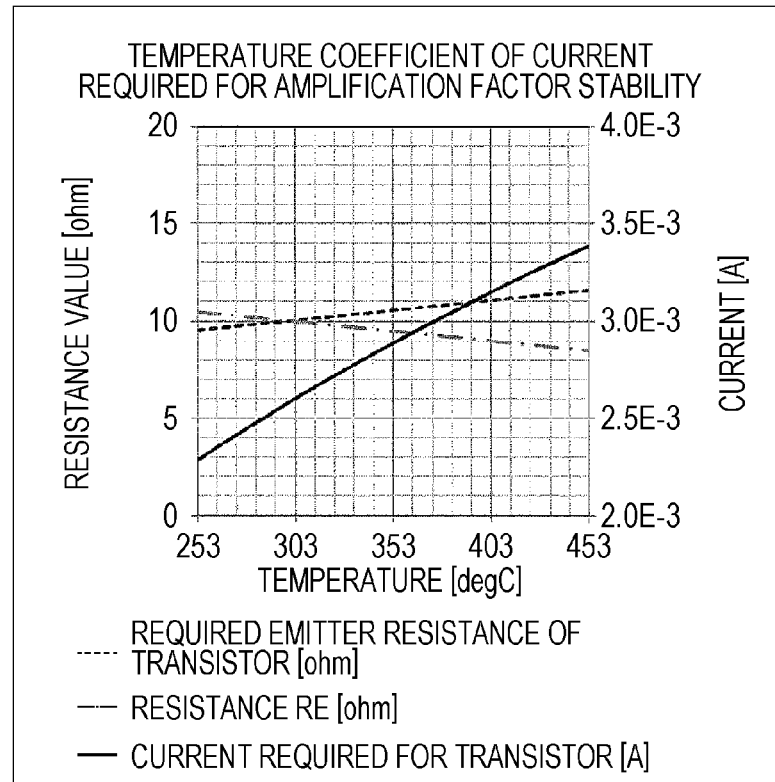
FIG. 4 is a graph showing the results of calculation to determine what temperature coefficient needs to be provided to current flowing through transistors $Q_7$, $Q_8$ in order to limit the temperature coefficient of the amplification factor to 10 ppm or below.

Hereinafter, the principle of this circuit will be described.

The base-emitter voltage (Vbe) of a transistor is determined by a current (Ic) flowing through the transistor. The value thereof is expressed by Mathematical Formula 5:

[Mathematical Formula 5]

$$Vbe = \{\ln(Ic) - \ln(Is)\} * kT/q \quad \text{(Mathematical Formula 5)}$$

wherein Is is a saturation current of the transistor and takes on a different value depending on the device, k is the Boltzmann constant: $1.38 \times 10^{-23}$ [m²kg K⁻¹ sec⁻²], T is an absolute temperature [K], and q is a charge: $1.60 \times 10^{-19}$ [C].

A current source $I_6$ is a current source having a temperature coefficient equal to or lower than a predetermined value, here equal to or lower than 10 ppm. Current sources $I_7$ and $I_8$ are current sources having a temperature coefficient equal to or larger than a predetermined value, here 1000 ppm.

Assume that currents of the current sources $I_6$, $I_7$ are equal at a reference room temperature. Under that condition, the base-emitter voltages of transistors $Q_9$, $Q_{10}$ are equal. In this case, the base voltages of transistors $Q_{11}$, $Q_{12}$ constituting a differential pair are equal, and currents flowing through $Q_{11}$, $Q_{12}$ also become equal.

Consider the case where the temperature rises or falls from the reference temperature. A current having a temperature coefficient of 10 ppm flows through the transistor $Q_9$, and a current having a temperature coefficient of 1000 ppm flows through the transistor $Q_{10}$. A temperature fluctuation causes a current difference between $Q_9$ and $Q_{10}$. With the current difference between $Q_9$ and $Q_{10}$ represented by $\Delta Ic$, using $\Delta Ic$, a difference $\Delta Vbe$ in base-emitter voltage between the transistors $Q_9$ and $Q_{10}$ is expressed by Mathematical Formula 6:

[Mathematical Formula 6]

$$\Delta Vbe = \ln(\Delta Ic) * kT/q \quad \text{(Mathematical Formula 6)}$$

$\Delta Vbe$ corresponds to a base voltage difference between the transistors $Q_{11}$ and $Q_{12}$. Under conditions where $\Delta Vbe$ occurs, a current Iq11 flowing through the transistor $Q_{11}$, assuming that it has a temperature coefficient of 1000 ppm equal to that of a current flowing through the transistor $Q_{10}$, is expressed by Mathematical Formula 7:

[Mathematical Formula 7]

$$Iq11 = \alpha Itail(1 + \Delta Ic)/(1 - \Delta Ic) \quad \text{(Mathematical Formula 7)}$$

wherein $\alpha$ is a constant determined by the circuit, and Itail is a current value of the current source $I_8$.

Here, an approximation expressed by Mathematical Formula 8 is used:

[Mathematical Formula 8]

$$\text{If } |x|<<1, \text{ then } 1/(1-x) \approx 1+x \quad \text{(Mathematical Formula 8)}$$

to approximate Mathematical Formula 7 to Mathematical Formula 9:

[Mathematical Formula 9]

$$Iq11 = \alpha Itail(1+\Delta Ic)^2 \quad \text{(Mathematical Formula 9)}$$

Further, an approximation by the following Mathematical Formula 10 is used:

[Mathematical Formula 10]

$$\text{If } |x|<<1, \text{ then } (1+x)^a = (1+ax) \quad \text{(Mathematical Formula 10)}$$

With this, Mathematical Formula 9 is approximated to Mathematical Formula 11:

[Mathematical Formula 11]

$$Iq11 = \alpha Itail(1+2\times\Delta Ic) \quad \text{(Mathematical Formula 11)}$$

As expressed by Mathematical Formula 11, the temperature coefficient of Iq11 is twice ΔIc, which shows that a power-saving small-scale circuit in the present invention also allows for adjustment of a temperature coefficient by addition and subtraction of two different temperature coefficients.

What is claimed is:

1. A bias circuit, comprising:

a first transistor including a base terminal, a collector terminal and an emitter;

a second transistor including a base terminal, a collector terminal and an emitter;

a first p-n junction element connected at one end to a constant-voltage source on a high-voltage side, the first p-n junction element being supplied at a p-n junction with a current having a temperature coefficient equal to or lower than 10 ppm (parts per million) by a first current source, to generate a voltage, the first current source being connected on a low-voltage side to a low-voltage constant-voltage source, and connected on a high-voltage side to a low-voltage side of the first p-n junction element and the base terminal of the second transistor, the temperature coefficient being a rate of change of a resistance value per degree in temperature;

a second p-n junction element connected at one end to the constant-voltage source on the high-voltage side, the second p-n junction element being supplied at a p-n junction with a current having a temperature coefficient equal to 1000 ppm by a second current source, to generate a voltage, the second current source being connected on a high-voltage side to a low-voltage side of the second p-n junction element and the base terminal of the first transistor;

a third p-n junction element connected to the constant-voltage source on the high-voltage side and the collector terminal of the first transistor;

a load resistance connected to the constant-voltage source on the high-voltage side and the collector terminal of the second transistor; and an output terminal located between the load resistance and the constant-voltage source on the high-voltage side, wherein the emitter terminal of the second transistor is connected to a third current source having a temperature coefficient equal to the temperature coefficient of the second current source, the second transistor receiving the supply of a current from the third current source, and the base of the second transistor receiving the voltage generated by the first p-n junction element, wherein the emitter terminal of the first transistor is connected to the third current source, the base of the first transistor receiving the voltage generated by the second p-n junction element, wherein the second transistor and the first transistor constitute a differential pair, and wherein at the collector terminal of the second transistor, a current having a temperature coefficient that is substantially twice the temperature coefficient of the current of the second current source is obtained.

* * * * *